(12) United States Patent
Xue

(10) Patent No.: US 7,053,945 B1
(45) Date of Patent: May 30, 2006

(54) IMAGE SENSOR HAVING BOOSTED RESET

(75) Inventor: Song Xue, Arcadia, CA (US)

(73) Assignee: Micron Technolopgy, Inc., Boise, ID (US)

( * ) Notice: Subject to any disclaimer, the term of this patent is extended or adjusted under 35 U.S.C. 154(b) by 818 days.

(21) Appl. No.: 09/917,195

(22) Filed: Jul. 26, 2001

Related U.S. Application Data

(60) Provisional application No. 60/221,347, filed on Jul. 26, 2000.

(51) Int. Cl.
 *H04N 5/335* (2006.01)
 *H03K 17/16* (2006.01)
 *G05F 1/10* (2006.01)

(52) U.S. Cl. ............... 348/294; 327/535; 327/390

(58) Field of Classification Search ........... 348/308, 348/302, 303, 304, 294; 327/535, 390, 536; 257/291, 292
See application file for complete search history.

(56) References Cited

U.S. PATENT DOCUMENTS

| | | | |
|---|---|---|---|
| 4,996,686 A * | 2/1991 | Imai et al. ............... 377/60 |
| 5,471,515 A | 11/1995 | Fossum et al. |
| 5,631,940 A * | 5/1997 | Fujikura ................... 377/64 |
| 5,900,623 A * | 5/1999 | Tsang et al. ........... 250/208.1 |
| 5,933,047 A * | 8/1999 | Zhu et al. ................. 327/534 |
| 5,949,271 A * | 9/1999 | Fujikura .................. 327/390 |
| 6,016,073 A * | 1/2000 | Ghilardelli et al. ....... 327/536 |
| 6,140,630 A | 10/2000 | Rhodes |
| 6,144,589 A * | 11/2000 | Micheloni et al. ..... 365/189.11 |
| 6,211,510 B1* | 4/2001 | Merrill et al. ........... 250/208.1 |
| 6,212,095 B1* | 4/2001 | Chevallier ................ 365/183 |
| 6,410,899 B1* | 6/2002 | Merrill et al. .......... 250/208.1 |
| 6,456,131 B1* | 9/2002 | Tran ........................ 327/157 |
| 6,456,541 B1* | 9/2002 | Tanzawa ............... 365/189.11 |
| 6,522,559 B1* | 2/2003 | Roohparvar et al. ......... 363/60 |
| 6,618,083 B1* | 9/2003 | Chen et al. ................ 348/243 |
| 6,798,274 B1* | 9/2004 | Tanimoto ................. 327/536 |
| 2002/0140689 A1* | 10/2002 | Huang et al. ............ 345/208 |

* cited by examiner

*Primary Examiner*—Tuan Ho
*Assistant Examiner*—Justin Misleh
(74) *Attorney, Agent, or Firm*—Dickstein Shapiro Morin & Oshinsky LLP

(57) ABSTRACT

A power supply reset boosting element which boosts a level of the reset voltage to a level higher than the level of the power supply. The boosted voltage is isolated from both the power supply and from undesired switching by special transistors which can withstand the voltage power supply level.

10 Claims, 7 Drawing Sheets

IMAGE SENSOR HAVING BOOSTED RESET

CROSS-REFERENCE TO RELATED APPLICATIONS

This application claims benefit of U.S. Provisional application No. 60/221,347, filed Jul. 26, 2000.

BACKGROUND

CMOS active pixel sensors are known, and have been described, for example, in U.S. Pat. No. 5,471,515. CMOS active pixel sensors are often very small, in order to make them compatible with current elements. While the device includes an in-pixel follower and/or other in-pixel transistors, size miniaturization often prevents a full complementary MOS type switch. This means, therefore, that a full-scale reset function within the active pixel circuit may be difficult.

In previous designs, this has prevented the operation from achieving full signal reset. This has led to smaller signal swing, lowered signal to noise ratio, and a lag effect in adjacent frames due to the incomplete reset. This kind of reset is often referred to as a soft reset. During such a soft reset, voltage levels on the sensor node may continuously change depending on the time that the reset persists. Ideally, this reset value should be set to the level Vdd–Vth, where Vdd is the drain supply and Vth is the threshold voltage of the transistor. However, the actual value may vary.

The soft reset may also limit the effective signal swing. This can be especially problematic in low voltage applications. For example, in a portable mode, the circuit may be powered from one or more batteries. Hence, the power supply may be limited to the battery voltage e.g. 1.5 V or 3 V levels.

SUMMARY

The present application teaches a special circuit which may improve reset operation in active pixel sensor type image sensor.

In one embodiment, a special bootstrap circuit is described which may boost this voltage of the switch signal to a level above the available power supply and protect against this signal causing undesired effects elsewhere in the circuit.

Another embodiment describes a multi level reset circuit.

Yet another embodiment describes a circuit for use in a shared line reset system.

BRIEF DESCRIPTION OF THE DRAWINGS

These and other aspects will now be described in detail, with reference to the accompanying drawings, wherein.

DETAILED DESCRIPTION

Figure 1:
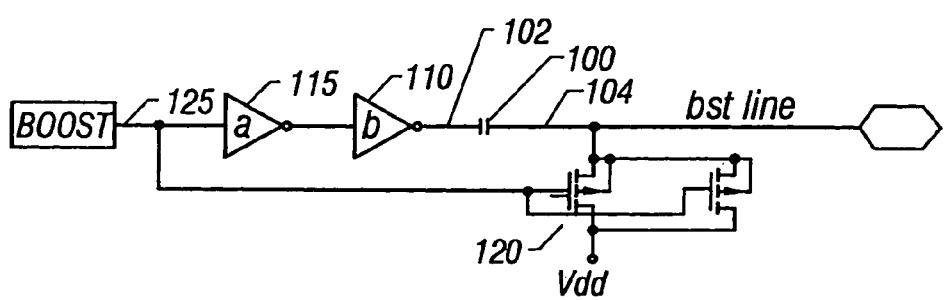
FIG. 1 shows a bootstrap circuit of an embodiment.

FIG. 1 shows a "bootstrap" circuit of an embodiment. This bootstrap circuit may increase the voltage output, e.g. the reset voltage level, to a level that is greater than the power supply voltage.

Driving signal 125 drives an inverter pair 115,110. The inverter 110 is connected to a first node 102 of the bootstrap capacitor 100. The incoming signal causes the node 102 to initially charge to the negative supply voltage Vss (e.g., ground) at node 102, while the other node 104 of the capacitor 100 is held at the drain/supply voltage Vdd via a PMOS transistor 120. The switching of the PMOS transistor is controlled by the incoming signal on line 125.

Once node 104 is charged to the level VDD, the boosting phase begins, when the input signal goes high, turning off transistor 120, thereby isolating the node 104 of capacitor 100, thereby floating the node 104 of the capacitor. During the same clock cycle, and two inverter delays later, the signal at 102 is brought high, thereby boosting the voltage at node 102. In principle, the voltage at node 104 should be capable of being pumpable to a voltage close to double the level of Vdd. This value may be used as a pixel reset value.

Figure 2:
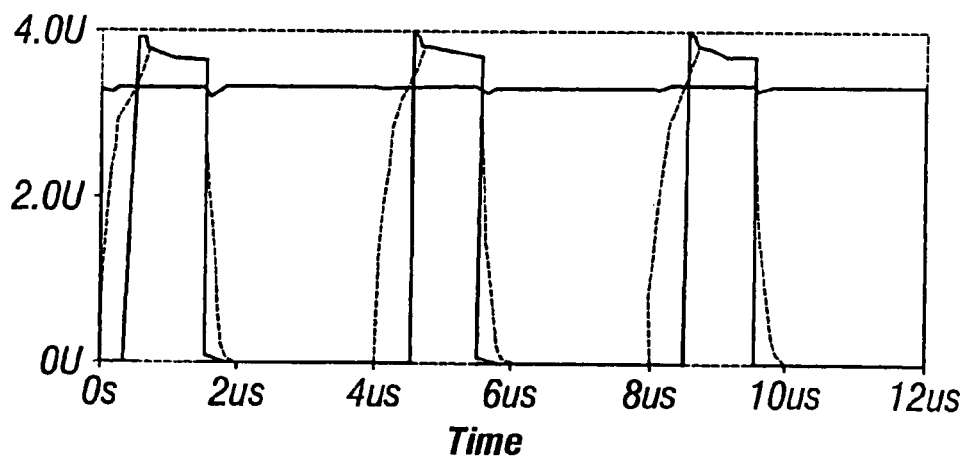
FIG. 2 shows simulation results from the FIG. 1 circuit.

In reality, a steady reset level will not be obtained, but rather simulation results are as shown in FIG. 2. For a 3.3 volt power supply, the node 102 may be pumped to voltage around 5 V initially, but reach a voltage less than 4 V in the steady state. Also, the level of the pulse varies according to a "pulse" shape, making it less suitable for use as a reset pulse.

The present inventor believed that the PMOS switch 120 was causing these problems, for the following reason. The PMOS transistor 120 is used in the circuit of FIG. 1 to precharge the capacitor 100 during the clock low phase. During the boosting phase, the switch 120 is turned off to isolate node 104. The inventor believes that transistor 120 does a very good job of precharging the capacitor. However, the relatively high voltage that occurs as a result of the pumping may effect the transistor's ability to isolate.

When a "normal" reset signal is being produced, VDD as applied to the PMOS gate can effectively isolate the drain node from the source node. The voltage at node 104, however, may be as large as double the level of VDD.

The results are that during the initial portion of the boosting phase, the voltage rises, causing the PMOS gate to conduct between node 104 and the power supply even if the gate voltage of the PMOS is at VDD. This causes charge from the node 104 to conduct to the power supply line, reducing the pulse voltage. This causes the spike shaped waveform that is noticed.

In addition, a spike of this shape may be injected on to the power supply line. Moreover, since this power supply may be connected to other power supply lines, noise may be added to the entire circuit that is being powered by these lines. This in turn may degrade the performance of the chip.

Moreover, the boosting circuit has typically been shared between a number of different rows of an image sensor. The passing gate from the boost line to each row reset line may also be implemented by a PMOS switch, to allow the relatively high voltage to be transferred. This may affect other rows in addition to the current row being reset. This may generate sufficient voltage on all reset lines, through their respective PMOS pass transistor, even though the gates of those transistors are held high. Even with pulldown resistances on each reset line, the injection of the boosting signal may produce a pulse e.g. as high as 500 mv. This pulse may cause difficulty in obtaining a reliable high quality image.

Other boot strap circuits are known, including the one described by Cho 1995.

Figure 3:
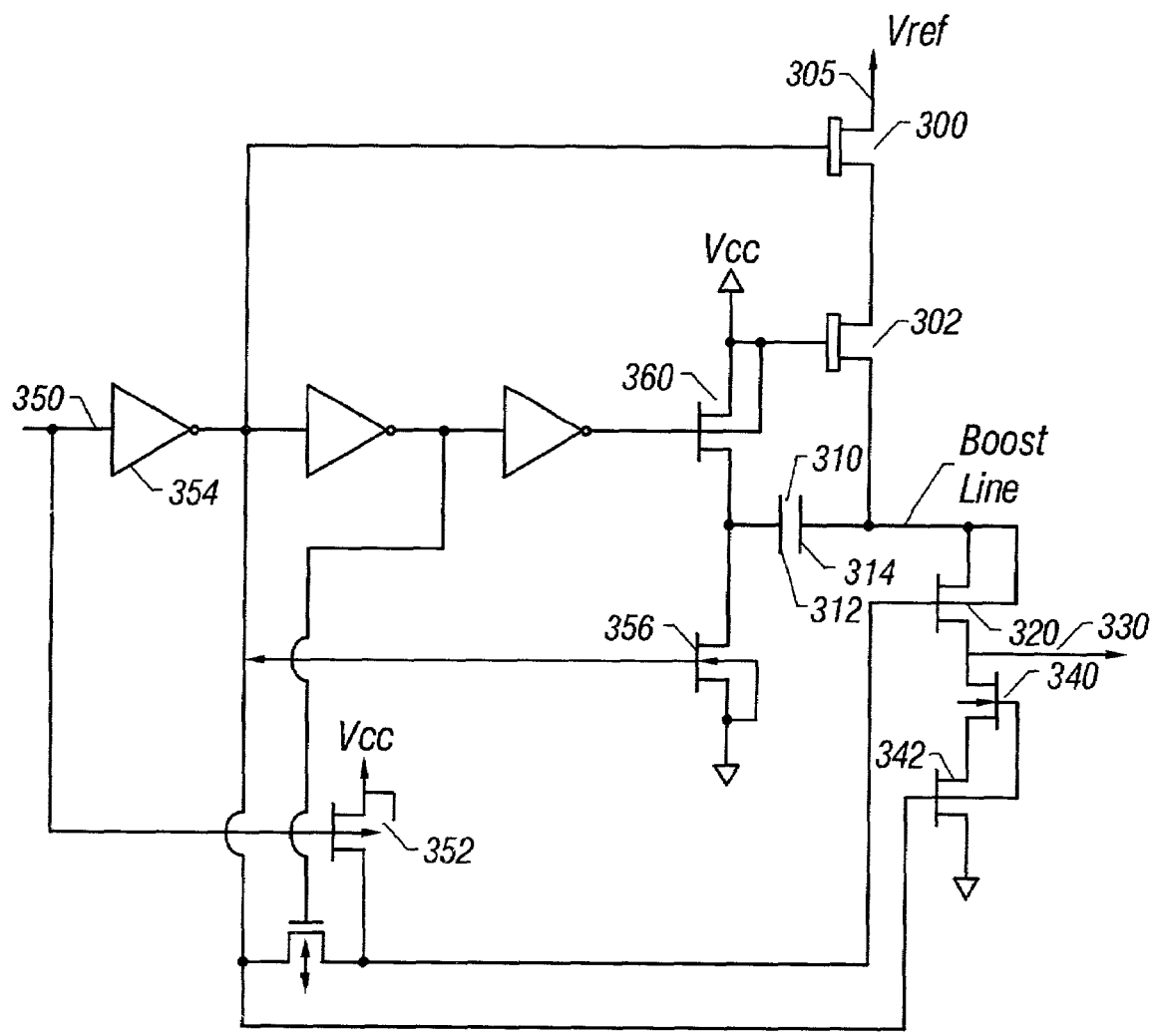
FIG. 3 shows an embodiment with improved switching and isolation characteristics.

FIG. 3 shows another embodiment to provide a boot strapping circuit to produce a hard reset signal that may avoid many of the issues noted above. In order to avoid the problems noted above, a special transistor pair is used for precharging. The precharge transistor 300 has a first node connected to reference voltage 305. For example, the drain of transistor 300 may be tied to the reference voltage 305. This reference voltage will be boosted to a level above the supply voltage VDD.

The initial precharge phase begins when the input signal 350 is low. The signal is inverted by inverter 354 to a high level, and drives the transistor 300 to conduct the reference voltage 305. Two more inverters in a line also drive the transistor 360 which is a PMOS transistor. The high level at the gate of the PMOS 360 turns that transistor off, with us allowing VCC to turn on the transistor 302. Thus, the voltage reference 305 is conducted to the rear plate node 314. The voltage at the output of inverter 354, again a high level, also drives NMOS transistor 356, must turning on that transistor, and thereby holding the front plate 312 of capacitor 310 at ground level. Thus, during this initial stage, the capacitor 310 has its front plate 312 being grounded, while its rear plate side node 314 is charged to the level of the reference voltage 305 through the precharge transistors 300, 302.

A transfer gate 320 is also held at VDD in order to isolate the boosting line from the output node 330.

At the time of the initial precharging, the output node 330 is pulled to ground via applying a high level to the gates of output pulldown transistors 340, 342.

During the boosting phase, the input signal at node 350 goes high, the system operates by first turning off the transistor 352 initially. After one further inverter delay by inverter 354, the signal turns off the transistors 340, 342 removing the ground level on the output node, 300 thereby removing the Vref charge and floating the node 314 of the capacitor, and 356, thereby removing the ground on the capacitor node 312. The precharge transistor 300 may be an N type transistor. Therefore, when its gate voltage is lowered by the output of inverter 354, a substantially perfect block against the boosting line, and the reference source Vref, may be obtained.

The circuit then may turn on a transfer gate 320, which allows any high voltage above the threshold to be passed to the output node.

Finally, VCC is applied to the front plate of the capacitor by turning on the charging transistor 360. This provides a substantially perfect flat boosting voltage on both the boosting line and on the output node. This prevents charge leakage both during the boosting phase and during switching.

The system has another advantage that it does not required dynamic precondition to be set prior to a first execution. Therefore, this circuit can be used for both continuous clock operation as well as with single pulse application.

Ideally, this system can boost a voltage of as high as VDD+Vref. However, the charge redistribution over 310 and the other capacitors connected to the boosting line may redistribute the charge. This means that the practical value of the boosting voltage will be $$V_{boost} = V_{dd} + \frac{C_1}{C_1 + C_{parasitic}} V_{ref}$$

This implies that driving the capacitor load may be maximized when the boosting capacitor is large enough to compensate for this reduction.

Figure 4:
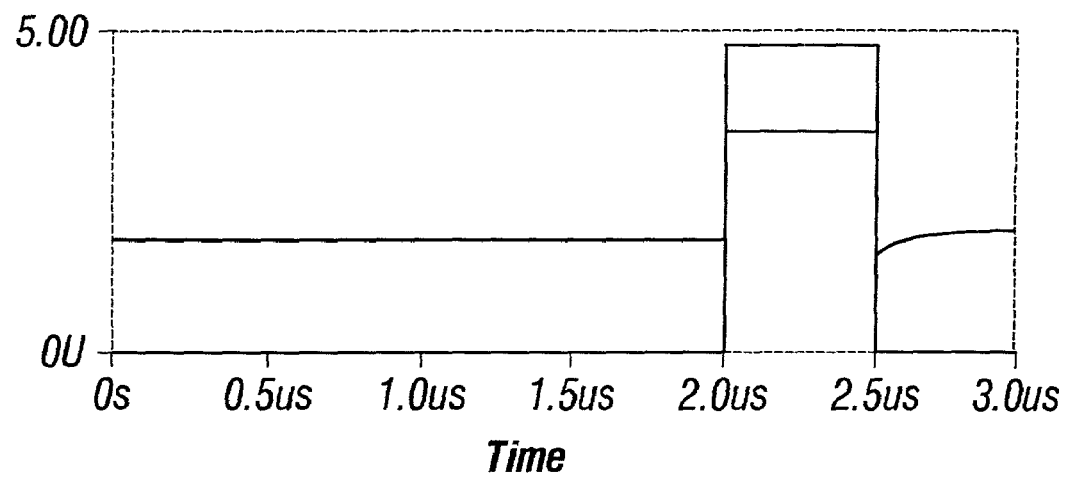
FIG. 4 shows a simulation of the results of the FIG. 3 circuit.
Figure 4:
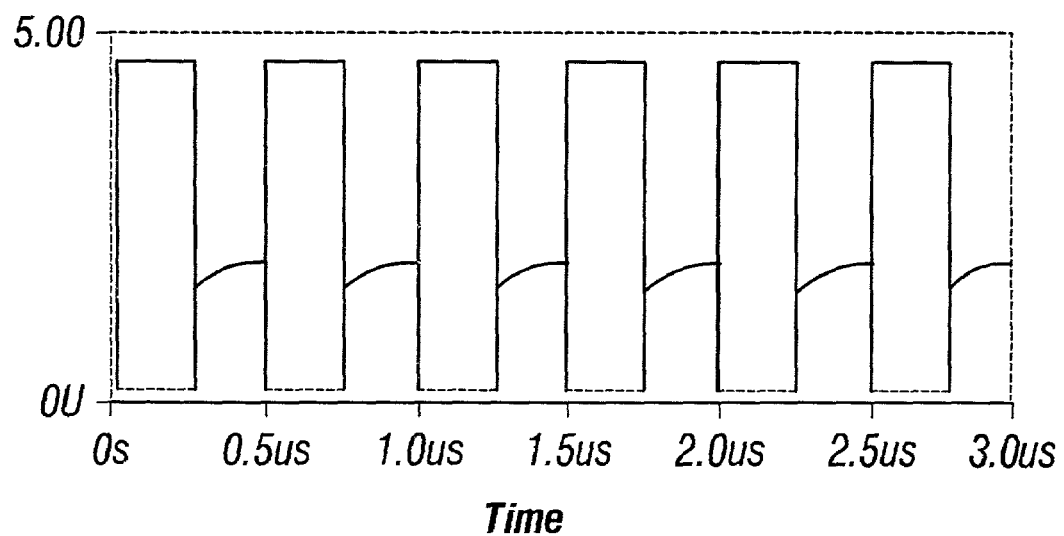

FIG. 4 shows a simulation of both a single reset pulse in the upper trace, and continuous power reset pulses in the lower trace.

In certain applications, two separate boosted values may be useful, e.g., to boost the level of a local n well at the same time as the boosting the reset level.

Figure 5:
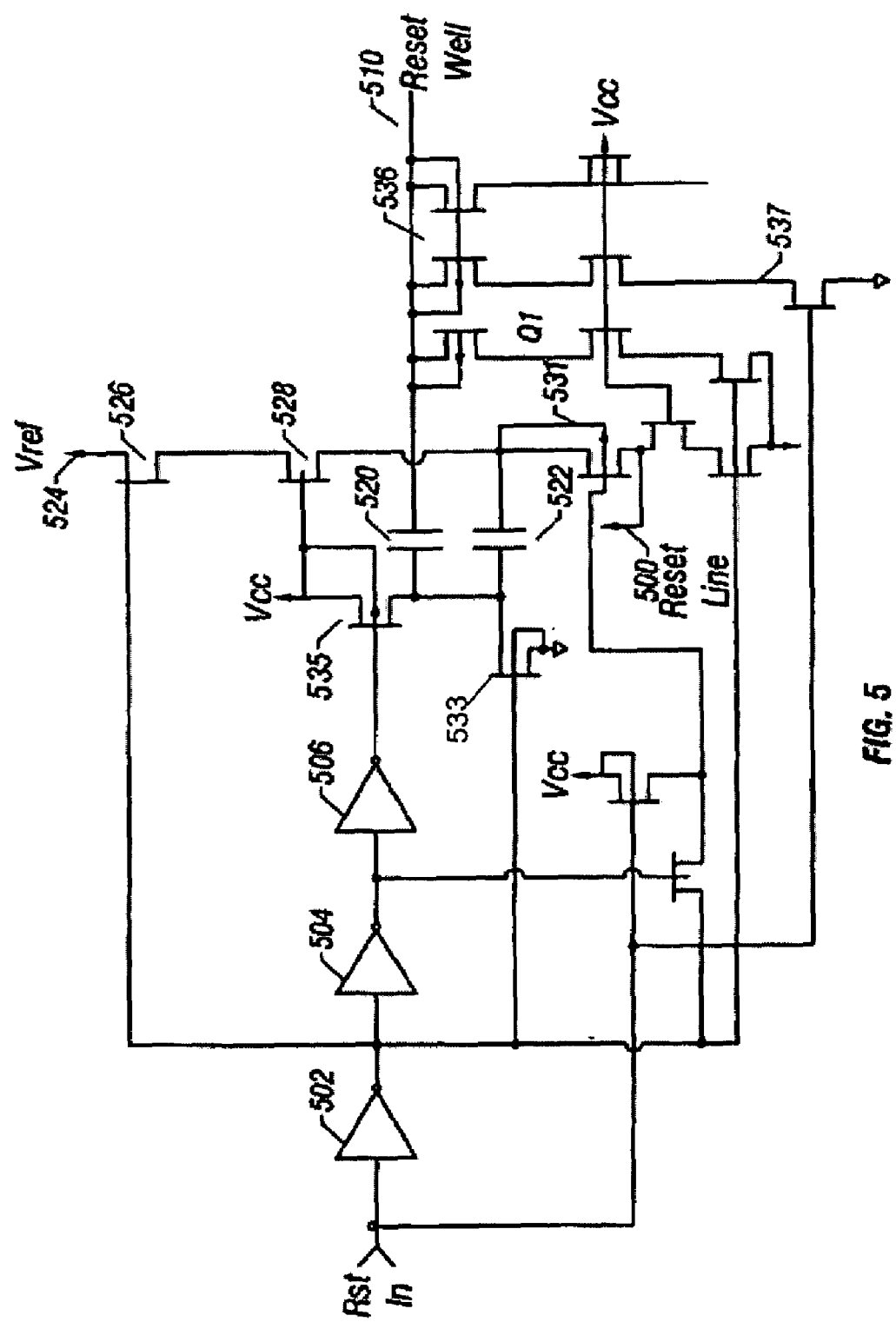
FIG. 5 shows an improved boosting circuit with double level boosting.

FIG. 5 shows a double boosting circuit which forms a second embodiment. The circuit produces two different boosted outputs, including a level controlled boosting signal on the output line 500, which may be for example VDD+2 volts in a 3.3 V system. A second output 510 produces a higher level voltage boosting such as for a local n well boosting. This second level may be closer to 2×VDD.

As in the FIG. 3 embodiment, the FIG. 5 embodiment also includes a line of inverters, here shown as 502, 504, 506. The signals from the signal chain, as inverted by different inverters, respectively drive two different sides of first and second capacitors 520, 522. The first output 500 is formed from the output of the capacitor 522. One end of this capacitor is driven from the reference voltage 524 through a pair of switching transistors 526, 528, much like in the first embodiment. Also, as in the first embodiment, the capacitor 522 can have its first plate shorted to ground via transistor 533, or driven with a voltage Vcc via transistor 535. The difference between the two voltages, that is Vcc+Vref may be present on the output line 500, as switched through the transistor 531.

That same transistor 535 that produces the voltage to capacitor 522, may also produce the voltage to the second capacitor 520. This transistor may be precharged with a different value, e.g. it may be charged with Vcc through one of the transistors 536. The output which it produces on the output line 510 may therefore be close to 2×Vcc.

This system has special parts which may avoid breakdown, punch through or latch up in the IC. In this system, the body of the transfer gate may be tied to the boosting line which may prevent latch up. The other transistors that are associated with the high voltage node are not similarly controlled. However, by adding additional transistors 528 and 537, at any moment the source drain voltage is insured not to exceed one power supply voltage. This may prevent the circuit from breaking down or punching through.

This system may improve the signal produced during the reset operation.

In another embodiment, this circuit may be applied to a linear sensor array using a row driver. In many of these systems, the line is shared between normal row reset and boosted row reset. In the multirow sensor array, the standard row driver would encounter several problems. This may be especially problematic when a shared line is used to implement the normal row reset and boosted reset operation.

Another embodiment describes a new row driver that enables sharing row selection and high voltage boosted reset. This circuit may carry out regular row selection during one mode and boost the same voltage line up to a controllable level during a reset operation. This may prevent charge leakage from the boosting line to the rest of the circuitry through the transistors. Therefore, this system may also eliminate noise spikes used by the boosting.

Figure 6:
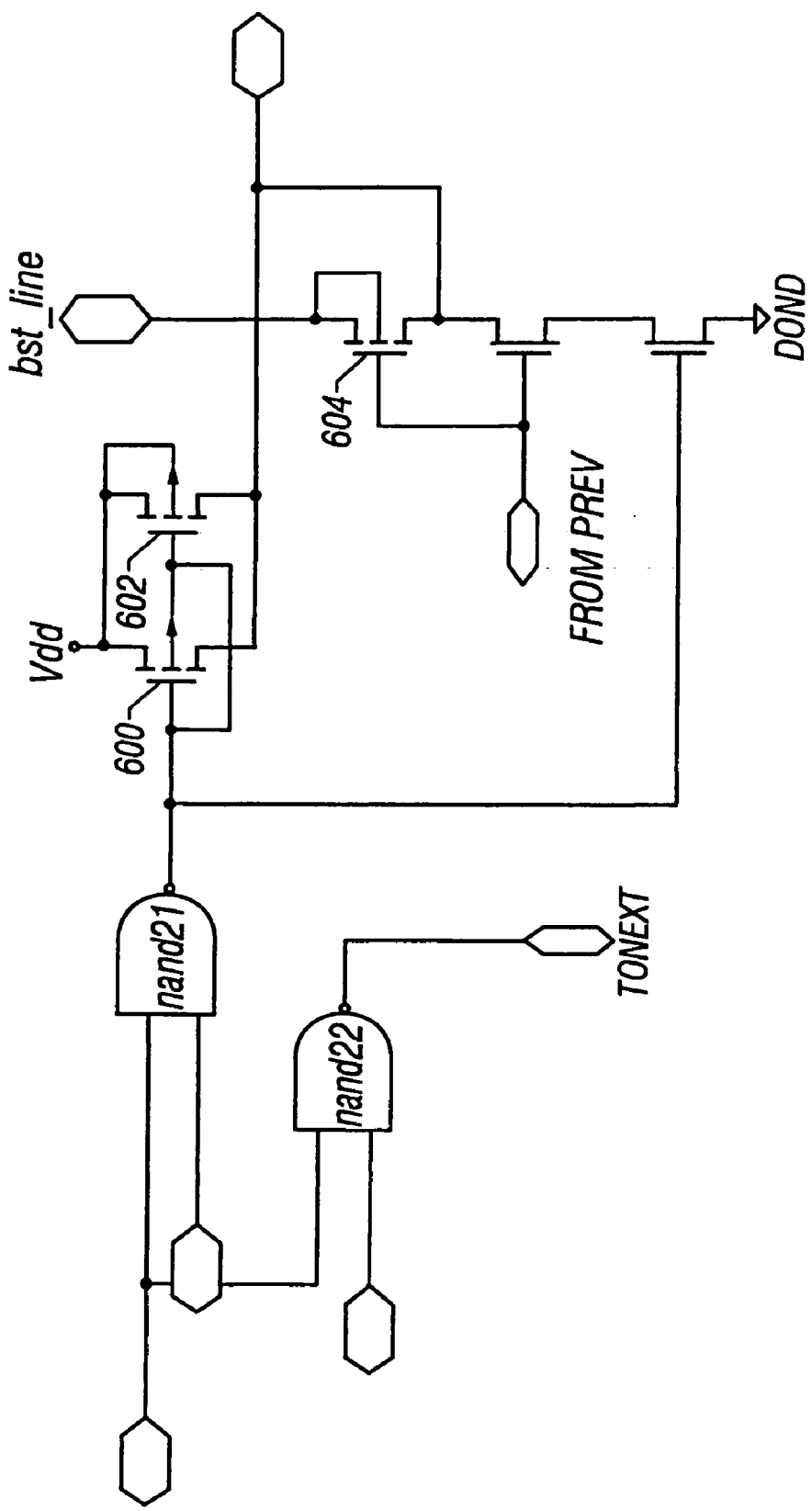
FIG. 6 shows a row driver circuit.

A row driver is shown in FIG. 6. Each row line is used as a reset line during an idle period in order to reset the function in the currently selected row. However, this may have the same problems as those discussed above when the reset level is increased. For example, the increased reset level may forward bias one of the switching transistors 600,602,604. For example, this may degrade the reset voltage, by causing the spike shaped pulse shape described above. It may also pass this reset voltage onto the row bus and to the power supply, as described above.

When the line is being used as a reset line, the transistors 600,602 are shut down by applying VDD to their gates. However, since the boosted voltage is above VDD plus Vthp, where Vthp is the threshold voltage of the PMOS transistor, both transistors may actually fully conduct. This may lead to two separate problems. The first, the boosting charge may quickly leak through the two transistors 600,602 to the power line. This prevents the high voltage reset from being completely implemented. Second, if the boosting capacitor is sufficiently large, which may be the case as described above, this may generate significant noise spikes in the power supply line.

During times when the row is not selected, additional problems may occur. The row signal is intended to be low, and isolated from the boosting signal. However, when the boost is increased enough, this boosting signal may pass onto each of the row biases; even those that are not currently selected. Ideally the transistor 604 is turned off by applying VDD to its gate. However, when the boosting voltage is above VDD plus Vthp, the boosting signal may be transferred onto all the row select lines. This may turn on multiple rows and also act as a weak reset applied to each pixel. This could damage the pixel array leading to signal degradation.

Figure 7:
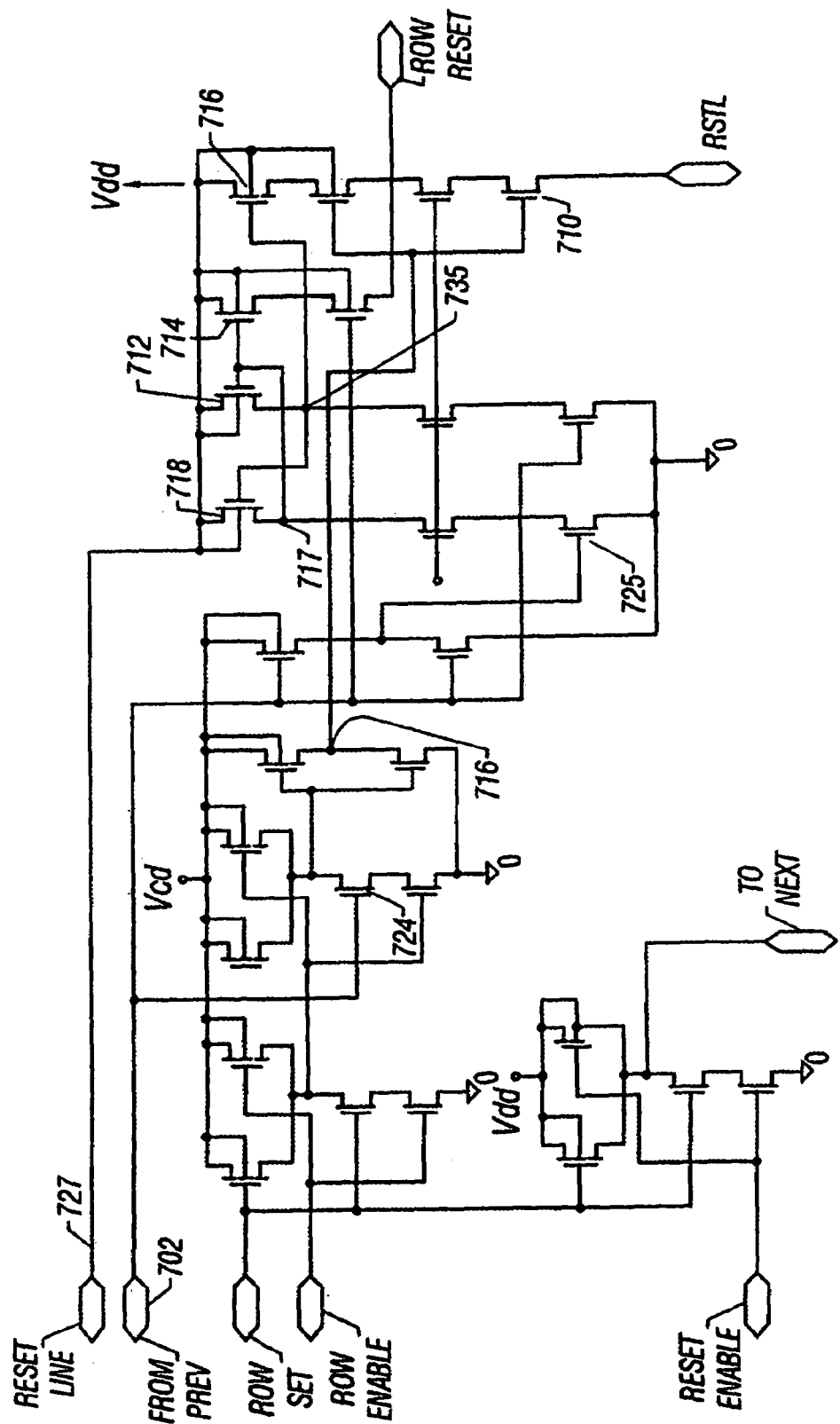
FIG. 7 shows a row driver circuit with improved isolation.

A new system that avoids this problem is shown in FIG. 7. This system allows both sharing the row line between reset and row select, the also allows a high (boosted) voltage reset. The system shown in FIG. 7 uses a latch type toggle structure to form selected levels for the boosting line and for the row select operation.

In this embodiment, each of the row lines is used as the reset line when the previous row is selected for readout. Therefore, when the previous row is selected, and the current row is in standby mode, the output of the current row is set to ground or to a given reset voltage. An external reset signal is applied into the driver block, forming a low signal to be sent to this driver on the FROM PREVIOUS input 702. This signal being low turns off the switching transistors 724, thereby producing a low output at 716. This low output is conducted to the gate of transistor 710. This turns off the transistor 710, and thus blocks the output from the reset low node. Subsequently, the system turns off the transistors 712 and 714 by pulling the node 717 to ground via the transistor 725. This also links the boosting line to the output.

The voltage on the output is a balanced voltage set by VDD which is located at the source of the transistor 716 and the precharge voltage 727 from the bootstrap circuit. This voltage enables the pixel to stay in the Preset mode e.g. half reset. When the boosted signal arrives at the node 727, it raises the voltage at node 735 and hence completely turns off the transistors 716 and 718 since the voltage on the node 735 is at the boosting level. Since the gates of these transistors 718 and 716 are at this boosted level, these two transistors are now able to substantially perfectly isolate the boosting line 727 from any of the other circuitry lines including from VDD. Thus, no leakage signal passes onto the power supply or to the other portions of the circuit. Only the output line is boosted to a high voltage on the selected row.

When the reset value goes low, the output line is pulled down again to resume the ground state or reset low voltage. When the current line is selected, the signal from FROM PREVIOUS remains high all the time, turning on the transistors 717 and 716 and allowing VDD to pass onto the output of the driver. During the time that bootstrapping takes place, the voltage on the boosting line will be increased to a higher reset voltage. At the same time, it completely isolates the row output line by applying the same voltage to the gate of the transistors 717, 716. This provides an improved environment for row select operation.

This row driver array may be implemented at a 5.5 micron pitch, for example.

Figure 8:
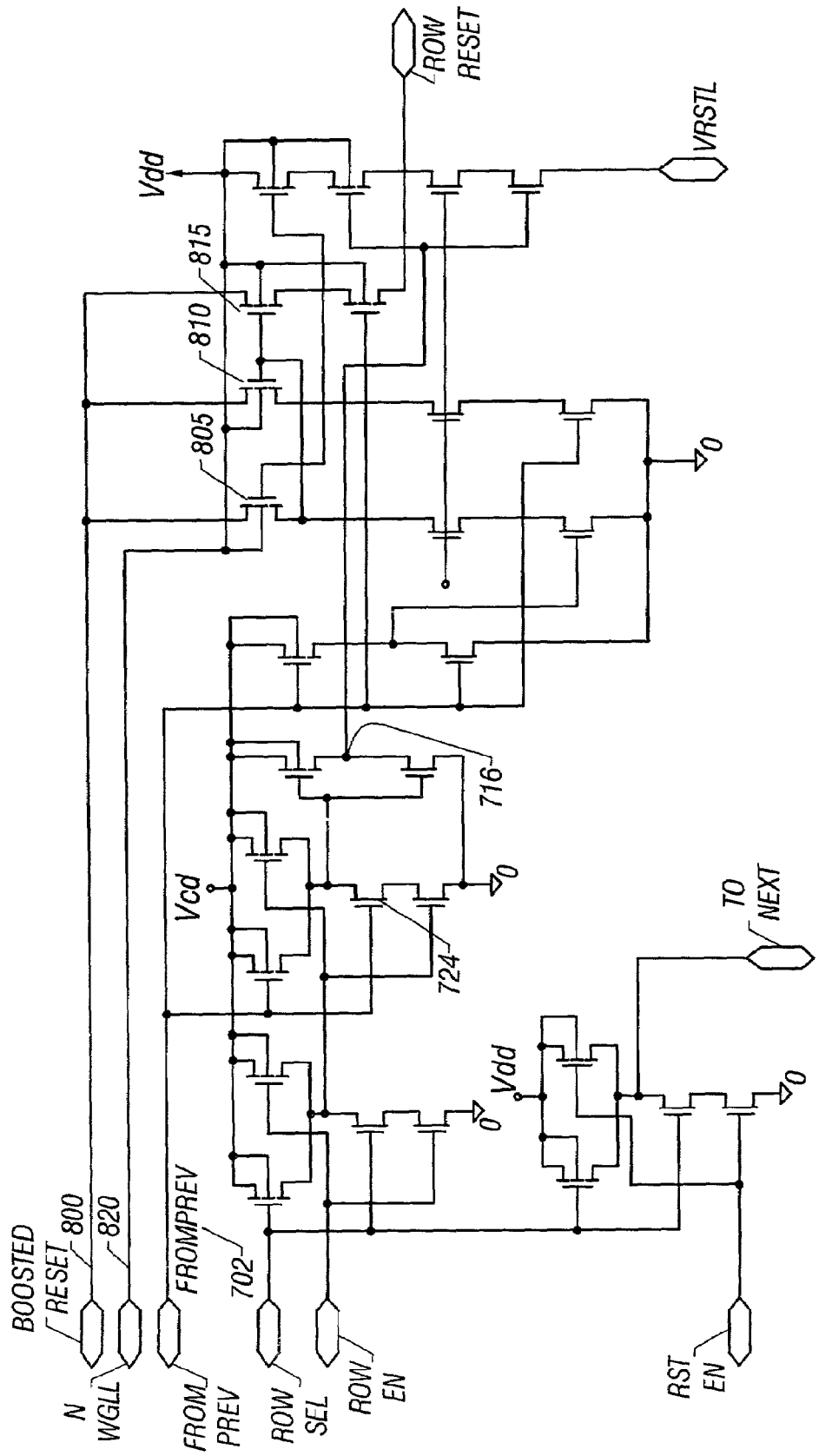
FIG. 8 shows a row driver circuit with separate boosting parts.

The embodiment of FIG. 8 shows an alternate embodiment of which may have separate boosting capabilities. In the FIG. 7 embodiment, the precharge level of the boosting circuit is presumed to be Vcc. However, a level controlled bootstrap function may encounter charge leakage through the silicon body.

In the embodiment shown in FIG. 8, a separate boosting line 800 is provided. The bodies of a plurality of switching transistors 805, 810, 815 are connected to this dedicated boosting line. Using a boosting system as shown in FIG. 5 allows the boost line 800 to be used as the normal bootstrap circuit at the desired boosting level. A separate boost line 820 may be connected, and may be used to bring up the local body potential of certain transistors. This ensures that the local body potential will always be higher than the source line and the drain line of the switching transistors, even when a boosting voltage is applied.

Although only a few embodiments have been disclosed in detail above, other modifications are possible. All such modifications are intended to be encompassed within the following claims, in which:

What is claimed is:

1. An image sensor, comprising:
    a photosensitive region;
    a voltage boosting circuit, said voltage boosting circuit producing a boosted reset voltage on a reset line at a level higher than a power supply output voltage level, said voltage boosting circuit comprising a first capacitor, and first and second switching elements, wherein said capacitor is first precharged at one plate by said first switching element, and subsequently isolated at said one plate by said second switching element, and biased at the other plate to produce an output voltage which is increased to a boosted voltage related to an amount of said bias added to an amount of said precharge, wherein said second switching element is one which is not forward biased by a voltage that is greater than the power supply voltage; and
    a voltage protection circuit, said voltage protection circuit being connected to said reset line and protecting at least one transistor against being forward biased by said boosted reset voltage.

2. An image sensor as in claim 1, wherein said voltage protection circuit further comprises at least one additional transistor of a type which can not be forward biased by said boosted reset voltage.

3. An image sensor as in claim 1, wherein said second switching element is an N type switching transistor.

4. An image sensor as in claim 1, wherein said second switching element includes first and second series connected switching transistors.

5. An image sensor as in claim 1, further comprising a second capacitor, charged to a different voltage then said first capacitor, to produce a second boosted output.

6. An image sensor as in claim 5, wherein one end of each of said first and second capacitors are charged by the same switch.

7. An image sensor as in claim 6, further comprising a row driver circuitry, which uses a first line as a row select, and second line, intended for row select of a different row than a currently selected row, for a reset line.

8. An image sensor as in claim 1, further comprising a row driver circuitry, which uses a first line as a row select, and a second line, intended for row select of a different row than a currently selected row, for a reset line.

9. An image sensor, comprising:
   a photosensitive region;
   a voltage boosting circuit, said voltage boosting circuit producing a boosted reset voltage on a reset line at a level higher than a power supply output voltage level, said voltage boosting circuit comprising a first capacitor, and at least one switching element;
   an output switch, which is capable of isolating against a voltage higher than a supply voltage, which is selectively turned on and off based on a level of boosting, wherein said output switch comprises a first passing transistor and a second shorting transistor, said first passing transistor in series between said boosted reset voltage and an output line, and said second shorting transistor connected between said output line and ground; and
   a voltage protection circuit, said voltage protection circuit being connected to said reset line and protecting at least one transistor against being forward biased by said boosted reset voltage.

10. An image sensor as in claim 9 wherein said first passing transistor is an NMOS type passing transistor, and said shorting transistor is a PMOS type shorting transistor.

* * * * *

UNITED STATES PATENT AND TRADEMARK OFFICE
CERTIFICATE OF CORRECTION

PATENT NO. : 7,053,945 B1  
APPLICATION NO. : 09/917195  
DATED : May 30, 2006  
INVENTOR(S) : Song Xue Page 1 of 1

It is certified that error appears in the above-identified patent and that said Letters Patent is hereby corrected as shown below:

On Title Page In Field (73), Assignee's name is corrected as follows:

"Micron Technolopgy, Inc." should read --Micron Technology, Inc.--.

In the Specification, the following errors are corrected:

Column 3, line 24, "must turning" should read --turning--;

Column 4, line 15, "as the boosting" should read --as boosting--;

Column 5, line 38, "the also" should read --and also--; and

Column 6, line 17, "of which" should read --which--.

Signed and Sealed this

Fifth Day of December, 2006

JON W. DUDAS  
*Director of the United States Patent and Trademark Office*